(12) United States Patent
Stadler et al.

(10) Patent No.: US 11,966,543 B2
(45) Date of Patent: Apr. 23, 2024

(54) OPERATING DEVICE FOR AN APPLIANCE, HOUSEHOLD APPLIANCE AND METHOD FOR CONTROLLING THE APPLIANCE

(71) Applicant: BSH Hausgeraete GmbH, Munich (DE)

(72) Inventors: Dominik Stadler, Regenstauf (DE); Carsten Zei, Sinzing (DE); Oliver Fischer, Munich (DE); Florian Rötzer, Neunburg (DE)

(73) Assignee: BSH Hausgeraete GmbH, Munich (DE)

( * ) Notice: Subject to any disclaimer, the term of this patent is extended or adjusted under 35 U.S.C. 154(b) by 0 days.

(21) Appl. No.: 17/964,220

(22) Filed: Oct. 12, 2022

(65) Prior Publication Data

US 2023/0115647 A1    Apr. 13, 2023

(30) Foreign Application Priority Data

Oct. 12, 2021 (DE) ...................... 10 2021 211 480.6

(51) Int. Cl.
*G06F 3/041* (2006.01)
*G06F 3/044* (2006.01)

(52) U.S. Cl.
CPC .......... *G06F 3/04182* (2019.05); *G06F 3/044* (2013.01)

(58) Field of Classification Search
CPC .............................. G06F 3/0416; G06F 3/0418
See application file for complete search history.

(56) References Cited

U.S. PATENT DOCUMENTS

| 9,092,098 | B2 * | 7/2015 | Konovalov ........... G06F 3/0418 |
| 9,178,510 | B2 | 11/2015 | Lin |
| 9,391,610 | B2 | 7/2016 | Gourevitch et al. |
| 11,354,000 | B1 * | 6/2022 | Shen .................... G06F 3/04166 |
| 11,444,623 | B2 * | 9/2022 | Yamada ............... H03K 17/962 |
| 2013/0222322 | A1 * | 8/2013 | Drew .................... G06F 3/0418 345/174 |
| 2018/0052558 | A1 | 2/2018 | Wang et al. |
| 2019/0004690 | A1 * | 1/2019 | Geyer ................. G06F 3/04847 |
| 2021/0041968 | A1 * | 2/2021 | Gray ................... G06F 3/04184 |

FOREIGN PATENT DOCUMENTS

| EP | 0818751 A1 | 1/1998 | |
| EP | 2549651 A1 | 1/2013 | |
| EP | 2506663 B1 * | 5/2017 | ............. H05B 6/065 |
| WO | 2015183461 A1 | 12/2015 | |
| WO | WO-2018172085 A1 * | 9/2018 | ......... H03K 17/9622 |

* cited by examiner

*Primary Examiner* — Darlene M Ritchie
(74) *Attorney, Agent, or Firm* — Laurence A. Greenberg; Werner H. Stemer; Ralph E. Locher

(57) ABSTRACT

An operating device contains a sensor surface, a signal generator for providing a control signal with a predetermined frequency for the sensor surface, an evaluation device which is configured to provide a sensor signal which is dependent on the capacitance of the sensor surface, and a control facility. In this process, the control facility is configured to determine measuring noise on the evaluation device at different frequencies and to select the frequency of the control signal in order to determine the sensor signal as a function of the determined measuring noise.

6 Claims, 3 Drawing Sheets

OPERATING DEVICE FOR AN APPLIANCE, HOUSEHOLD APPLIANCE AND METHOD FOR CONTROLLING THE APPLIANCE

CROSS-REFERENCE TO RELATED APPLICATION

This application claims the priority, under 35 U.S.C. § 119, of German Patent Application DE 10 2021 211 480.6, filed Oct. 12, 2021; the prior application is herewith incorporated by reference in its entirety.

FIELD AND BACKGROUND OF THE INVENTION

The invention relates to an operating device for an appliance. In particular, the invention relates to an operating device with a capacitive touch sensor for controlling an appliance.

A household appliance, for instance a cooker, is configured to heat up cooking utensils. The intensity of the heating process can be controlled by means of an operating device. The operating device has an electrode, the touch of which by a user is determined by detecting how the capacitance of the electrode changes. To this end, the electrode can be applied with a control signal with a predetermined frequency and a charging or discharging behavior of the electrode can be determined.

Such an operating device can be interrupted by a plurality of influences which may be present in the region of the appliance. For instance, a high- or low-frequency electromagnetic signal can be coupled in a cable-bound or wireless manner so that an evaluation device may provide unreliable determinations.

It was proposed to change the frequency of the control signal in accordance with a predetermined pattern. A probability that an existing interference source covers signals with all used frequencies of the control signal may be minimal.

At any rate, this interference suppression method may not deliver satisfactory results, however. It was suggested to use a temporal average value of determined capacitances in order to detect a touch. As a result, a good suppression of interferences can be realized. It may be disadvantageous here that a response behavior of the electrode is less spontaneous. A user who is accustomed to a very fast reaction from an operating device may find this unpleasant.

SUMMARY OF THE INVENTION

An object underlying the present invention therefore consists in providing an improved technique for identifying a touch of a sensor surface for the purpose of controlling an appliance. The invention achieves this object by means of the subject matter of the independent claims. Dependent claims represent preferred embodiments.

According to a first aspect of the present invention, an operating device has a sensor surface; a signal generator for providing a control signal with a predetermined frequency for the sensor surface; an evaluation device which is configured to provide a sensor signal which is dependent on the capacitance of the sensor surface; and a controller. In this process the controller is configured to determine measuring noises on the evaluation device at different frequencies and to select the frequency of the control signal in order to determine the sensor signal as a function of the determined measuring noise.

In accordance with the invention, the frequency is only then changed if it can be determined that another frequency is more advantageous for the determination of the sensor signal. As a result, a very quick response behavior can be combined with a very good interference resistance. Used frequencies can differ sufficiently from one another in order to rule out as far as possible a uniform interference by an interference source.

The measuring noise is preferably determined on the sensor signal. In a preferred embodiment, a moving average can be determined across measured values of the sensor signal, wherein the moving average indicates the noise. The measured values are preferably sampled with a predetermined frequency. The moving average can comprise differences between consecutive measured values. The differences can be added together over a predetermined time period and divided by the number of measured values detected in this time period. Furthermore, the difference between the consecutive measured values can preferably be assessed as an amount. The measuring noise can be determined in the following way:

$$N = \frac{\sum_{n=1}^{NumSamples} |val_{n-1} - val_n|}{NumSamples};$$

wherein the following applies:
N:=measuring noise,
NumSamples:=a number of considered, consecutive sensor signals, and
val:=a determined sensor signal.

In other embodiments, another variable which indicates the measuring noise can also be used, for instance a signal-to-noise ratio (also: signal to interference ratio; signal-to-noise ratio, SNR).

The controller is preferably configured to interrupt a determination of the sensor signal when the sensor surface is excited with a primary frequency in order to determine the measuring noise when the sensor surface is excited with a secondary frequency. The primary and the secondary frequency can be selected from a number of predetermined frequencies. A control signal of the primary frequency is currently used to determine the sensor signal. A control signal with the secondary frequency is preferably evaluated periodically, in particular intermittently. Should it emerge that the measuring noise is smaller when a control signal is used with the secondary frequency than with the primary frequency, the secondary frequency can therefore be used as the new primary frequency.

An interruption in the control of the sensor surface with the control signal of the primary frequency is preferably carried out periodically by the control with the control signal with the secondary frequency. In this regard an average time during which the secondary frequency is used is preferably significantly less than a time during which the primary frequency is used.

A ratio of times between the primary and the secondary frequency can be in the range of 10 to 1 or higher.

The determination of the measuring noise when the secondary frequency is used can only then take place when the determined measuring noise exceeds a predetermined threshold value with respect to the primary frequency. As a result, the operating device can be fully available for the determination of a touch, while good conditions exist for its evaluation. Only when the conditions are worse can an attempt be made to reduce the measuring noise by selecting another frequency for the control signal.

The evaluation device is preferably configured to determine the sensor signal on the basis of the control signal by means of a sigma delta method. The sensor signal is preferably provided in digital form and can comprise a predetermined value range. The value range can be expressed in binary form with a number of bits, for instance approximately 12 to 15, in one particularly preferred embodiment approximately 13 bits.

It is further preferred that provision be made for a determination circuit for determining a user touching the sensor surface on the basis of the sensor signal. With the determination, the sensor signal can be subjected to a low pass in order as far as possible to ignore just a brief touch or an interference when the capacitance of the sensor surface is determined.

Provision can be made for a driver which is configured to control a consumer as a function of the determined touch. In different embodiments the driver can be included in the household appliance or in the operating device and is preferably configured to control an electrical power implemented by means of the consumer as a function of the touch. The operating device further preferably contains a number of sensor surfaces, which can each be examined by a user in a manner described herein with respect to touch. The consumer can be controlled as a function of an operating mode, wherein the operating mode is determined on the basis of one or more touches of one or more sensor surfaces. A number of consumers which can be controlled by means of one or more sensor surfaces can also be provided.

According to a further aspect of the present invention, a household appliance contains an operating device described herein.

According again to a further aspect of the present invention, a method includes steps for providing a control signal with a predetermined frequency on a sensor surface; providing a sensor signal which is dependent on a capacitance of the sensor surface; determining the measuring noise on the evaluation device at different frequencies; and selecting the frequency of the control signal in order to determine the sensor signal as a function of the determined measuring noise.

The method can be executed partially or completely by means of an operating device described herein. To this end, the method can exist as a computer program product with program code means. The computer program product can be saved on a computer-readable data carrier. For execution of the method, the operating device can comprise a programmable microcomputer or microcontroller. Advantages or features of the method can be transferred to the device and vice versa.

It is further preferred that a number of frequencies are predetermined; wherein in order to determine the sensor signal a primary frequency is used for the control signal. A determination of the measuring noise at the secondary frequency can only take place when the measuring noise at the primary frequency reaches a predetermined threshold value. The secondary frequency can also be used periodically as a control signal in order to determine an applicable measuring noise. Both frequencies can be selected from a predetermined selection of frequencies. In a preferred embodiment, only two frequencies are predetermined, the roles of which can be interchanged as primary and secondary frequencies so that in each case the frequency at which the lower measuring noise occurs can be used to determine a touch of the sensor surface.

In another embodiment, more than two frequencies can also be provided. One of the frequencies can be determined as a primary frequency and one or more others as secondary frequencies. Should the measuring noise at the primary frequency exceed a predetermined threshold value, then one of the other frequencies can be determined as the primary frequency. The threshold value can be fixedly predetermined or relate to a measuring noise at one of the other frequencies.

In a particularly preferred embodiment, the measuring noise is firstly determined using the secondary frequency if the measuring noise exceeds a predetermined threshold value using the primary frequency. The threshold value can be predetermined as absolute or relative with respect to the sensor signal.

Other features which are considered as characteristic for the invention are set forth in the appended claims.

Although the invention is illustrated and described herein as embodied in an operating device for an appliance, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
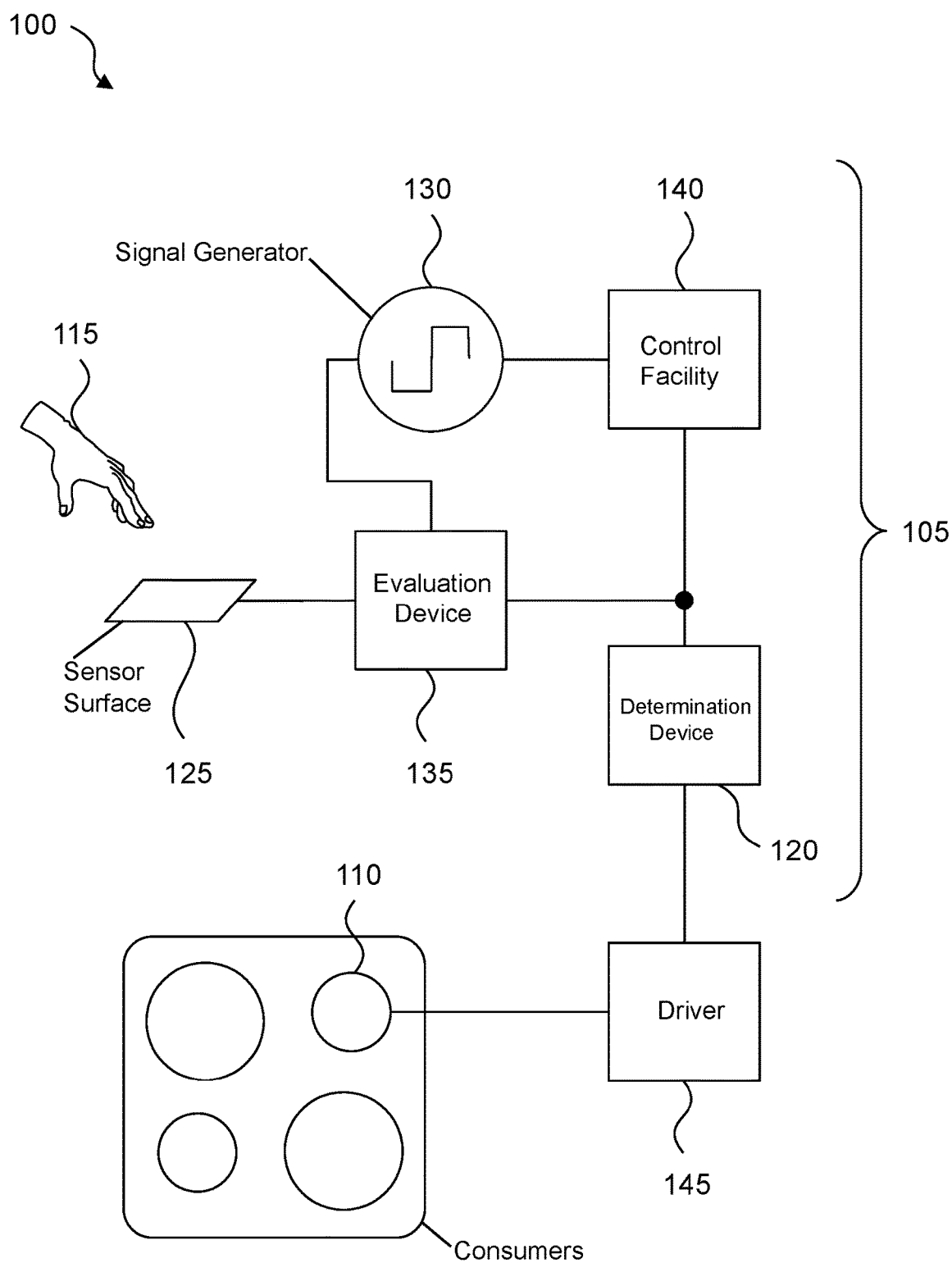
FIG. 1 is a block diagram of a household appliance according to the invention.

Referring now to the figures of the drawings in detail and first, particularly to FIG. 1 thereof, there is shown a household appliance 100 with an operating device 105. Purely by way of example, the household appliance 100 is shown as a cooker. The household appliance 100 contains one or more consumers 110, wherein in the present case a consumer 110 can correspond to a heating element for a cooking pot.

The operating device 105 is configured to detect a touch by a user 115 and to control the consumer 110 as a function of the touch. A determination circuit 120 can be provided in order to determine a touch and possibly to convert a control signal into a function delivered by means of the consumer 110.

The operating device 105 contains a sensor surface 125, a signal generator 130, an evaluation device 135 and a controller 140. The signal generator 130 is designed to supply the sensor surface 125 with a control signal in a predetermined frequency. The evaluation device 135 is configured to provide a sensor signal indicating a capacitance of the sensor surface 125. The controller 140 is configured to control the signal generator 130 in order to adjust a frequency of the control signal. Moreover, the controller 140 can determine a measuring noise in the sensor signal of the evaluation device 135. The evaluation device 135 can be configured to compensate for an influence of the frequency of the control signal on the determined sensor signal.

A driver 145 is optionally provided in order to control the consumer 110 on the basis of a signal provided by the determination circuit 120. In the case of an induction cooker, the driver 145 can comprise a control for an inductive coil 110. On a radiation cooktop, the driver 145 can comprise a phase-angle control. The driver 145 can also comprise a semiconductor-based flow-current valve (solid state relay) or a relay, for instance.

In a preferred embodiment, a modulation capacitor is charged by means of a current source. Charge from the modulation capacitor is then recharged in a capacitor formed with the sensor surface 125, then the capacitor is discharged again by means of short-circuiting. In this process the capacitance of the modulation capacitor is preferably at least one order of magnitude greater than that of the capacitor formed with the sensor surface 125. The charging of the capacitor from the modulation capacitor and the discharging is repeated periodically with a predetermined frequency, while a voltage of the modulation capacitor is monitored at the same time. How often the capacitor can be charged from the modulation capacitor until its voltage drops to below a predetermined threshold value is counted here. The determined number can be used as an indication of the capacitance of the capacitor and thus of a touch of the sensor surface 125 by the user 115. The current source, a counter and a controller for charging and discharging the capacitors can be included in a programmable microcontroller. In one embodiment, the modulation capacitor has approximately 5,000 times the capacitance of the capacitor to be determined, if there is no touch of the sensor surface 125 and the counter can count up to $2^{13}$ cycles. Other designs are likewise possible.

It is proposed that the controller 140 controls the signal generator 130 so as to use a first frequency. At the same time, the controller 140 can determine a measuring noise on the sensor signal of the evaluation device 135. Under predetermined conditions, for instance when the determined measuring noise exceeds a predetermined threshold value, the controller 140 can control the signal generator 130 so as to provide the control signal with a second frequency. In the thus materializing sensor signal, the controller 140 can again determine a measuring noise. The controller 140 can then decide whether the measuring noise is smaller using the first or the second frequency. The determination of the capacitance of the sensor surface 125 can then be continued with the more advantageous frequency on the basis of the control signal.

Figure 2:
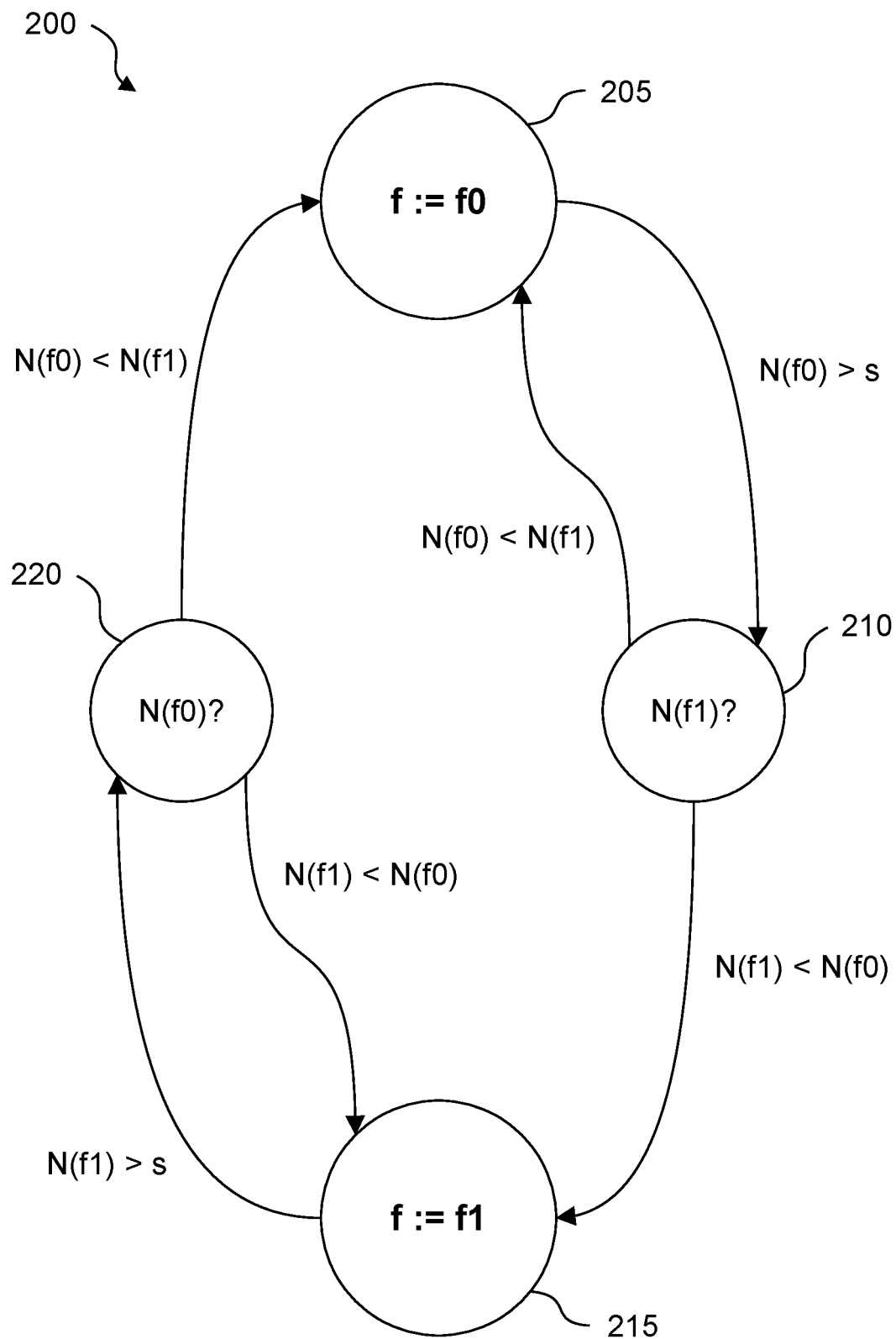
FIG. 2 is a flow chart of a method for controlling an appliance.

FIG. 2 shows a flow chart of a method 200 for controlling an appliance, in particular the household appliance 100. The method 200 is shown in the form of a status transition system. In a first state 205, with which the method 200 can begin, a frequency f0 is assumed for the control signal of the signal generator 130 on the sensor surface 125. The sensor surface 125 is controlled with the control signal of the selected frequency and a noise or measuring noise of the sensor signal can be determined when the frequency f0 is used as the primary frequency. Moreover, a filter chain which is related to the secondary frequency f1 can be updated. To this end, a change can be made periodically to the secondary frequency f1.

Under one predetermined condition, for instance periodically or when it is determined that the determined measuring noise exceeds a predetermined threshold value s with respect to f0, in step 210 a measuring noise can be determined with respect to the other frequency f1. To this end, the sensor surface 125 can be excited by means of the signal generator 130 with a control signal of the frequency f1. A sensor signal produced in the process can be examined for noise. It is then possible to determine that the noise with respect to the initially used frequency is less than or greater than the noise with respect to the other frequency. If the first frequency brings about less noise, it is then possible to return to step 205. On the other hand, if the other frequency brings about less noise, it is possible to branch into step 215.

Step 215 corresponds to step 205, but the other frequency f1 as the primary frequency is selected as the frequency of the control signal of the sensor surface 125. With respect to this frequency, a measuring noise of the sensor signal of the evaluation device 135 is determined. A filter chain with respect to the first frequency f0 can be updated.

Under a further predetermined condition, for instance when the determined measuring noise with respect to the selected frequency f1 exceeds a predetermined threshold value, it is possible to branch into step 220. Step 220 corresponds to step 210 with the difference that a measuring noise is determined with respect to the frequency f0. To this end, the control signal with the frequency f0 can be applied to the sensor surface 125.

If a thus determined measuring noise with respect to the frequency f0 is less than the previously determined measuring noise with respect to the frequency f1, it is then possible to branch into step 205, where f0 is selected as the new primary frequency for the control signal on the sensor surface 125. On the other hand, the method 200 can move back to step 215, where the frequency f1 is selected for the control signal of the sensor surface 125.

Figure 3:
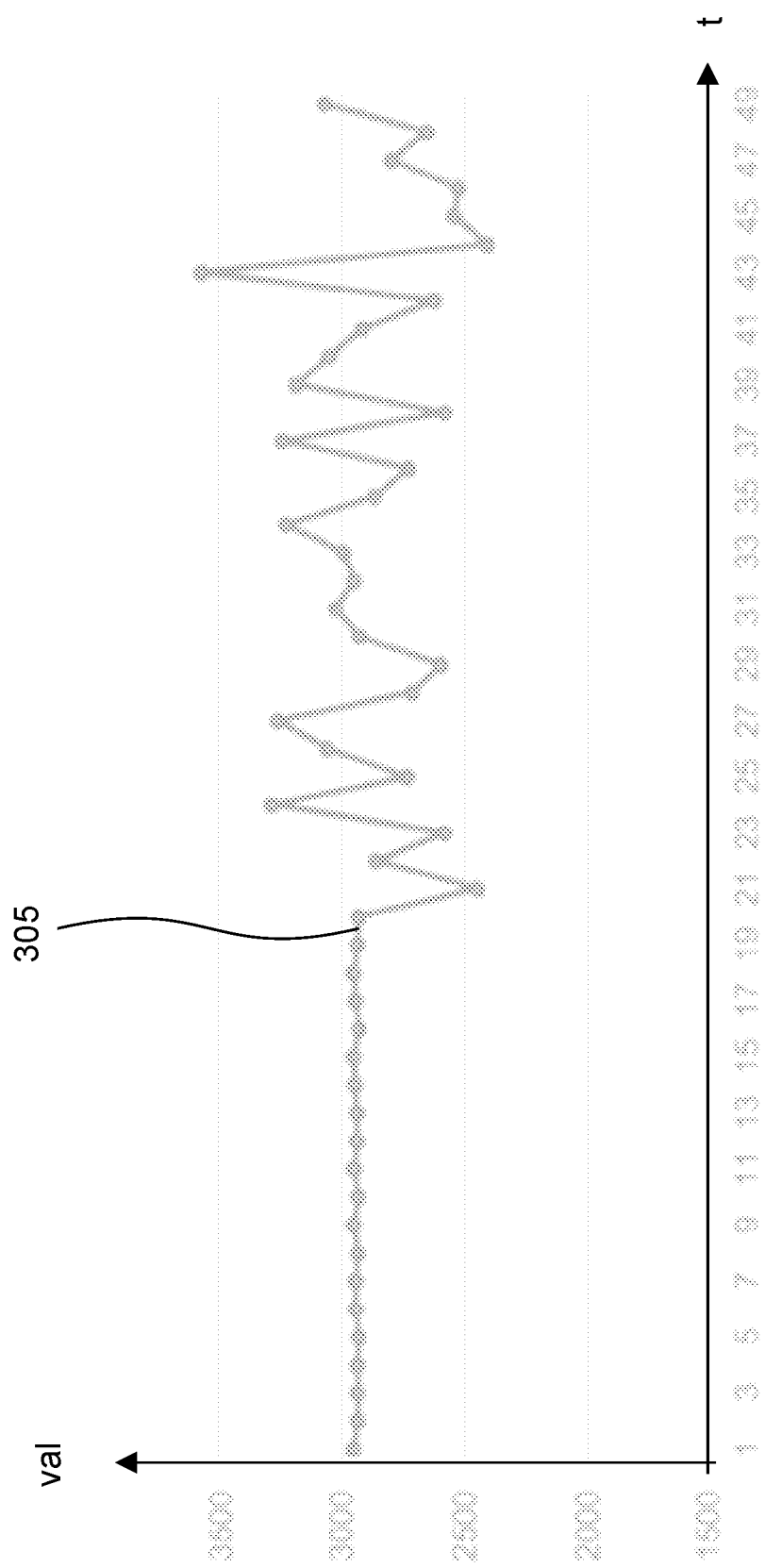
FIG. 3 is a graph showing an exemplary sensor signal.

FIG. 3 shows an exemplary sensor signal 305. Individual measurements of the sensor signal are marked in the horizontal direction. The sensor signals are plotted as values in the vertical direction. Scales of both axes are to be considered as exemplary.

Between time instants 1 and 20 the sensor signal is not influenced by an interference source.

The considered values differ from one another only minimally and a measuring noise can be correspondingly minimal.

An interference signal in the region of the sensor surface 125 is coupled between measured values 21 and 49. Consecutive measured values have significantly larger relative distances from one another. A determined measuring noise in this region is considerably greater than in the first region described above.

By selecting a control signal with a suitable frequency, the influence of the interference signal can be minimized. In the example shown, the first frequency f0 can correspond to the first region between the measured values 1 and 20, and the second frequency f1 to the region between the measured values 21 and 49. In both instances, it is not assumed that the sensor surface 125 is touched by a user 115. In the embodiment shown, it is preferred to continue to determine a touch on the basis of the first frequency f0.

The following is a summary list of reference numerals and the corresponding structure used in the above description of the invention:

100 Household appliance
105 Operating device
110 Consumer
115 User
120 Determination circuit
125 Sensor surface, electrode
130 Signal generator
135 Evaluation device
140 Controller
145 Driver 200 Method
205 Control sensor surface with f=f0
Determine noise (N) at f0
210 Determine noise (N) at f1
215 Control sensor surface with f=f1
Determine noise (N) at f1
220 Determine noise (N) at f0
305 Sensor signal

The invention claimed is:

1. A household appliance operating device, comprising:
a sensor surface;
a signal generator for providing a control signal with a predetermined frequency;
an evaluation device configured to provide a sensor signal being dependent on a capacitance of said sensor surface;
a controller configured to determine measuring noise on said evaluation device at different predetermined frequencies and to select a frequency of the control signal in order to determine the sensor signal in dependence on the measuring noise determined, said controller configured to determine the measuring noise using a secondary frequency only when the measuring noise determined using a primary frequency exceeds a predetermined threshold, the threshold being absolute or relative with respect to the sensor signal;
said controller additionally configured to interrupt a determination of the sensor signal when said sensor surface is excited with a primary frequency, in order to determine the measuring noise when said sensor surface is excited with a secondary frequency, said interruptions taking place periodically; and
a driver configured to control a consumer in dependence on a determined touch.

2. The operating device according to claim 1, wherein the measuring noise is determined based on the sensor signal.

3. The operating device according to claim 1, wherein said evaluation device determines the sensor signal on a basis of the control signal by means of a sigma delta method.

4. The operating device according to claim 1, further comprising a determination circuit for determining a user touching said sensor surface on a basis of the sensor signal.

5. The household appliance operating device according to claim 1, wherein a ratio between average times of use of the primary frequency and the secondary frequency is 10 to 1 or higher.

6. A method for controlling a household appliance, which comprises the steps of:
providing a control signal with a predetermined frequency on a sensor surface;
providing a sensor signal dependent on a capacitance of the sensor surface;
determining measuring noise by an evaluation device at different predetermined frequencies, the measuring noise being determined using a secondary frequency only when the measuring noise determined using a primary frequency exceeds a predetermined threshold, the predetermined threshold being absolute or relative with respect to the sensor signal;
interrupting a determination of the sensor signal when the sensor surface is excited with a primary frequency, in order to determine the measuring noise when the sensor surface is excited with a secondary frequency, the interruptions taking place periodically;
selecting a frequency of the control signal in order to determine the sensor signal in dependence on the measuring noise determined; and
controlling a consumer in dependence on a determined touch.

* * * * *